United States Patent
Landgraf et al.

(10) Patent No.: US 9,831,171 B2
(45) Date of Patent: Nov. 28, 2017

(54) CAPACITORS WITH BARRIER DIELECTRIC LAYERS, AND METHODS OF FORMATION THEREOF

(71) Applicant: Infineon Technologies AG, Neubiberg (DE)

(72) Inventors: Bernd Landgraf, St. Martin (AT); Jens Hahn, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/539,557

(22) Filed: Nov. 12, 2014

(65) Prior Publication Data

US 2016/0133560 A1 May 12, 2016

(51) Int. Cl.
| | |
|---|---|
| H01L 21/768 | (2006.01) |
| H01L 21/8234 | (2006.01) |
| H01L 21/4763 | (2006.01) |
| H01L 21/44 | (2006.01) |
| H01L 23/52 | (2006.01) |
| H01L 27/108 | (2006.01) |
| H01L 23/522 | (2006.01) |
| H01L 49/02 | (2006.01) |

(52) U.S. Cl.
CPC .......... *H01L 23/5223* (2013.01); *H01L 28/91* (2013.01); *H01L 2924/0002* (2013.01)

(58) Field of Classification Search
CPC ....... H01L 21/70; H01L 21/768; H01L 21/02; H01L 21/311
USPC .......... 257/516, E21.004, E21.008; 438/396, 438/253, 687
See application file for complete search history.

(56) References Cited

U.S. PATENT DOCUMENTS

| | | | | |
|---|---|---|---|---|
| 6,115,233 A | * | 9/2000 | Seliskar | H01L 27/0688 257/296 |
| 6,399,495 B1 | * | 6/2002 | Tseng | H01L 21/76807 257/E21.008 |
| 6,693,017 B1 | * | 2/2004 | Fayaz | H01L 27/0805 257/303 |
| 6,759,703 B1 | * | 7/2004 | Matsuhashi | H01L 28/75 257/306 |
| 6,939,800 B1 | * | 9/2005 | Lu | H01L 21/3121 257/E21.26 |
| 6,963,503 B1 | * | 11/2005 | Rahim | G11C 16/0441 365/185.05 |
| 2005/0161765 A1 | * | 7/2005 | Tsau | H01L 21/76807 257/528 |
| 2005/0233519 A1 | * | 10/2005 | Chang | H01L 21/76802 438/253 |
| 2007/0080426 A1 | * | 4/2007 | Matz | H01L 23/5223 257/516 |
| 2007/0173029 A1 | * | 7/2007 | Abadeer | H01L 28/60 438/396 |
| 2008/0135732 A1 | * | 6/2008 | Toumiya | H01L 27/14625 250/208.1 |

(Continued)

*Primary Examiner* — Duy T Nguyen
*Assistant Examiner* — Brian Turner
(74) *Attorney, Agent, or Firm* — Slater Matsil, LLP

(57) ABSTRACT

A device including a first metal feature is disposed in a first insulating layer. A second metal feature is disposed in a second insulating layer and separated from the first metal feature by a portion of a first etch stop liner disposed between the first and the second insulating layers. The second metal feature is capacitively coupled to the first metal feature through the first etch stop liner.

21 Claims, 12 Drawing Sheets

(56) References Cited

U.S. PATENT DOCUMENTS

| | | | | |
|---|---|---|---|---|
| 2008/0303155 A1* | 12/2008 | Lu | ............ | H01L 21/3121 |
| | | | | 257/751 |
| 2009/0194845 A1* | 8/2009 | Werner | ............ | H01L 27/10852 |
| | | | | 257/532 |
| 2010/0302854 A1* | 12/2010 | Wu | ............ | G11C 11/34 |
| | | | | 365/185.18 |
| 2013/0113075 A1* | 5/2013 | Feng | ............ | H01L 23/5223 |
| | | | | 257/532 |

* cited by examiner

CAPACITORS WITH BARRIER DIELECTRIC LAYERS, AND METHODS OF FORMATION THEREOF

TECHNICAL FIELD

The present invention relates generally to capacitors, and, in particular embodiments, to capacitors with barrier dielectric layers, and methods of formation thereof.

BACKGROUND

Semiconductor devices are used in a variety of electronic and other applications. Semiconductor devices comprise, among other things, integrated circuits or discrete devices that are formed on semiconductor wafers by depositing one or more types of thin films of material over the semiconductor wafers, and patterning the thin films of material to form the integrated circuits.

There is a demand in semiconductor device technology to integrate many different functions on a single chip, e.g., manufacturing analog and digital circuitry on the same die. In such applications, large capacitors are extensively used for storing an electric charge. They are rather large in size, being several hundred micrometers wide depending on the capacitance, which is much larger than a transistor or memory cell. Consequently, such large capacitors occupy valuable silicon area increasing product cost. Such large capacitors are typically used as decoupling capacitors for microprocessor units (MPU's), RF capacitors in high frequency circuits, and filter and analog capacitors in mixed-signal products.

Thus, what are needed in the art are cost effective ways of forming semiconductor chips with increased functionality, good reliability, but without significant utilization of chip area.

SUMMARY

In accordance with an embodiment of the present invention, a device including a first metal feature is disposed in a first insulating layer. A second metal feature is disposed in a second insulating layer and separated from the first metal feature by a portion of a first etch stop liner disposed between the first and the second insulating layers. The second metal feature is capacitively coupled to the first metal feature through the first etch stop liner.

In accordance with another embodiment of the present invention, a method of forming a device comprises forming a first metal feature in a first insulating layer over a substrate and forming a second metal feature in a second insulating layer. The second metal feature is separated from the first metal feature by a portion of a first etch stop liner between the first and the second insulating layers. The second metal feature is capacitively coupled to the first metal feature through the first etch stop liner.

In accordance with another embodiment of the present invention, a method of forming a capacitor comprises forming a first insulating layer over a substrate, forming a first metal feature in the first insulating layer, and forming an etch stop liner over the first insulating layer. The method further includes forming a second insulating layer over the etch stop liner and forming a second metal feature in the second insulating layer. The second metal feature is separated from the first metal feature by a portion of the etch stop liner.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A and 1B illustrates a magnified view of a chip in accordance with an embodiment of the present invention, wherein FIG. 1A illustrates a cross sectional view and FIG. 1B illustrates a top view;

DETAILED DESCRIPTION OF ILLUSTRATIVE EMBODIMENTS

The present invention will be described with respect to various embodiments in a specific context, namely a structure and method for forming a high density capacitor. In various embodiments, the invention may be used in a number of semiconductor components. Examples of such components include system on chip (SoC), microprocessor units (MPU's), high frequency circuits, and mixed-signal products.

Large capacitors such as metal-insulator-metal (MIM) capacitors are planar capacitors and typically comprise two metal plates sandwiched around a capacitor dielectric that is parallel to a semiconductor wafer surface. The capacitor is formed by a masking and patterning step. For example, the top capacitor metal plate is formed by a planar deposition of a conductive material, and lithographically patterning and etching the conductive material using a reactive ion etch (RIE) process.

A structural embodiment of the invention will be first described using FIG. 1. Embodiments of the methods of fabrication will be described using FIGS. 2-4. Various structural embodiments will then be described using FIGS. 5 and 6.

Figure 1A:
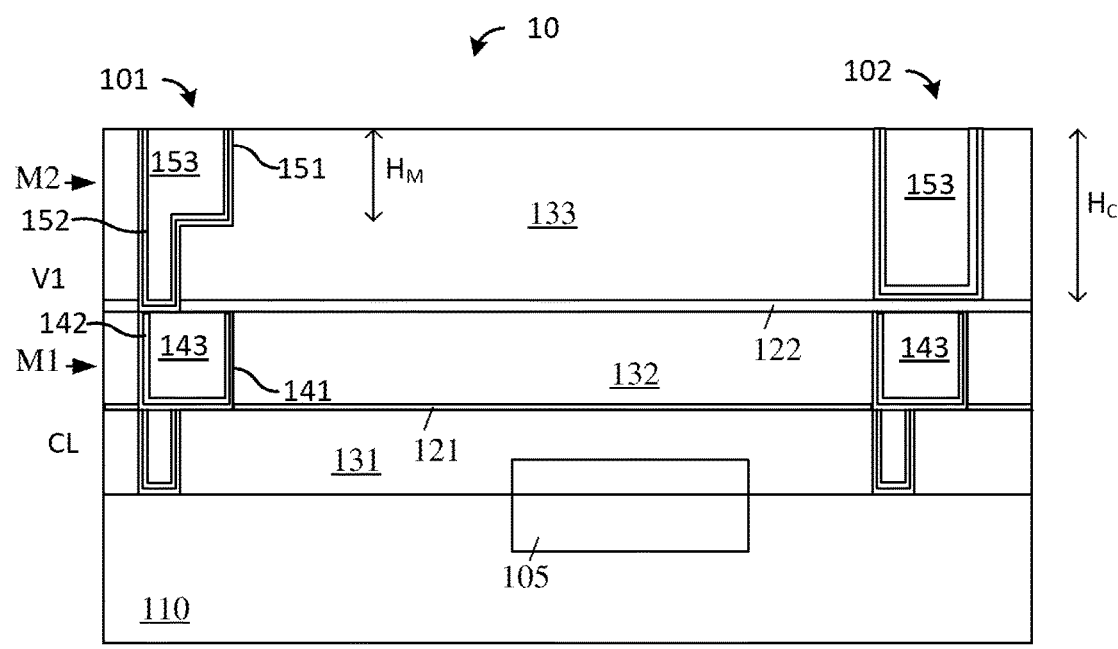
Figure 1B:
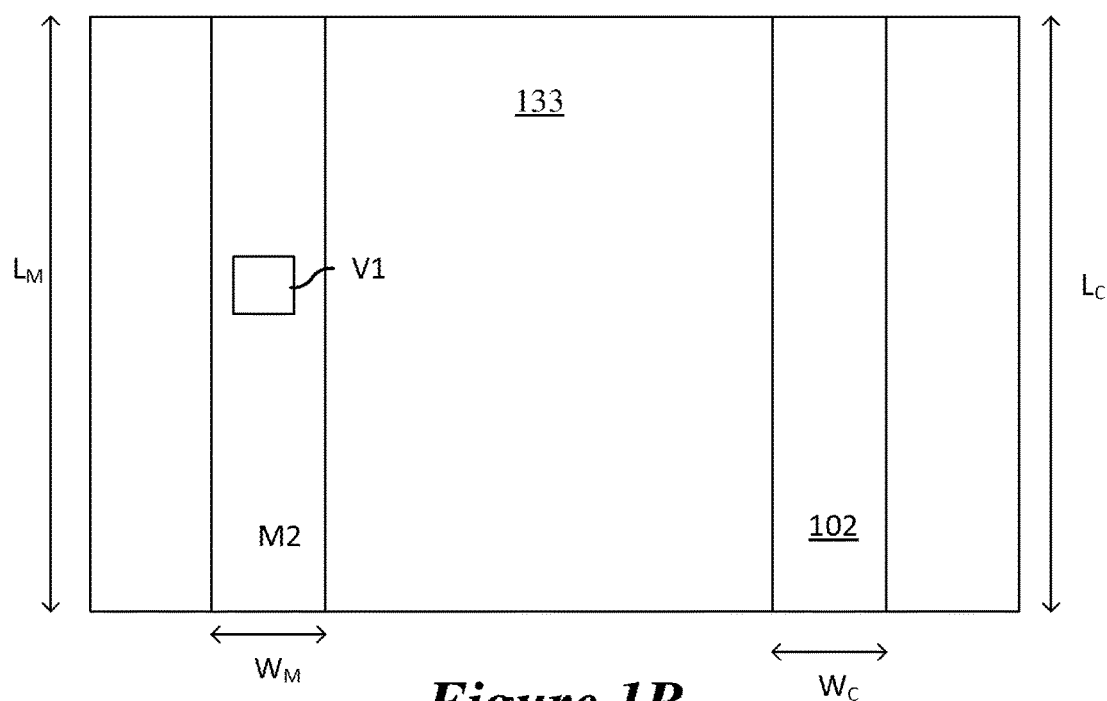

An embodiment of the invention is illustrated in FIGS. 1A and 1B. FIG. 1A illustrates a magnified cross sectional view of a chip in accordance with an embodiment of the present invention. FIG. 1B illustrates a magnified top view of a chip in accordance with an embodiment of the present invention.

The semiconductor chip 10 (not shown to scale) contains active circuitry disposed inside it. The active circuitry may be formed in and/or over a substrate 110 and includes the active device regions 105 and includes necessary transistors, resistors, capacitors, inductors or other components used to form integrated circuits. For example, active areas that include transistors (e.g., CMOS transistors) can be separated from one another by isolation regions, e.g., shallow trench isolation. In various embodiments, the semiconductor chip 10 may be formed on a silicon substrate 110. Alternatively, in other embodiments, the semiconductor chip 10 may have been formed on silicon carbide (SiC). In one embodiment, the semiconductor chip 10 may have been formed at least partially on gallium nitride (GaN). In alternative embodiments, the substrate 110 may comprise semiconductor on insulator substrates such as SOI as well as compound semiconductors such as GaAs, InP, InSb, SbInP, and others. The substrate 110 may include epitaxial layers including heteroepitaxial or homoepitaxial layers. Some examples of the substrate 110 are a bulk mono-crystalline silicon substrate (or a layer grown thereon or otherwise formed therein), a layer of (110) silicon on a (100) silicon wafer, a layer of a silicon-on-insulator (SOI) wafer, or a layer of a germanium-on-insulator (GeOI) wafer. In other embodiments, other semiconductors such as silicon germanium, germanium, gallium arsenide, indium arsenide, indium gallium arsenide, indium antimonide, or others can be used as the substrate 110.

Next, metallization is formed over the active device regions to electrically contact and interconnect the active devices. The metallization and active device regions together form a completed functional integrated circuit. In other words, the electrical functions of the chip 10 can be performed by the interconnected active circuitry. In logic devices, the metallization may include many layers, e.g., nine or more, of copper or alternatively of other metals. In memory devices, such as DRAMs, the number of metal levels may be less and may be aluminum.

The illustration in FIG. 1A shows two metal level of metallization, which comprises a contact level (CL) (mostly containing a W plug), a first metal level M1, a via level V1, and second metal level M2. Referring to FIG. 1A, a first insulating layer 131 is disposed over the substrate 110. The first insulating layer 131 may comprise an etch stop layer in one or more embodiments.

The first insulating layer 131 comprises $SiO_2$ such as tetra ethyl oxysilane (TEOS) or fluorinated TEOS (FTEOS), but in various embodiments may comprise insulating materials typically used in semiconductor manufacturing for inter-level dielectric (ILD) layers, such as doped glass (BPSG, PSG, BSG), organo silicate glass (OSG), carbon doped oxides (CDO), fluorinated silicate glass (FSG), spin-on glass (SOG), or low-k and low-k insulating materials, e.g., having a dielectric constant of about 4 or less, such as SiLK or porous SiCOH, or dielectric diffusion barrier layers or etchstop layers such as silicon nitride (SiN), silicon oxynitride (SiON), silicon carbide (SiC) or silicon carbo nitride (SiCN), e.g., having a dielectric constant of about 4 or combinations or multiple layers thereof, as examples, although alternatively, the first insulating layer 131 may comprise other materials. The first insulating layer 131 may also comprise dense SiCOH or a porous dielectric having a k value of about 3 or lower, as examples. The first insulating layer 131 may also comprise an ultra-low-k (ULK) material having a k value of about 2.3 or lower, for example. The first insulating layer 131 may comprise a thickness of about 500 nm or less, for example, although alternatively, the first insulating layer 131 may comprise other dimensions. The copper lines in case of copper BEOL may be capped by tungsten containing selective grown metal such as $W_xCo_yP_z$.

A first etch stop liner 121 is disposed over the first insulating layer 131 and a second insulating layer is disposed over the first etch stop liner 121. A first metal level M1 is formed within the second insulating layer 132, each metal line comprising a first metal liner 141, a second metal liner 142, and with a first fill metal 143.

In one embodiment, the first via level V1 and the second metal level M2 may be formed within a third insulating layer 133 as a single structure comprising a first conductive liner 151, a second conductive liner 152, and with a second fill metal 153.

In conventional lateral capacitors built by metal lines, the maximum capacitance is limited by the design rules for minimum pitch (minimum distance) between adjacent metal lines. Similarly, for vertical capacitors between metal lines, the maximum capacitance is limited by the design rules for the distance between these metal lines.

Embodiments of the present invention overcome these problems by forming a vertical capacitor 102 separated by a common second etch stop liner 122. The second etch stop liner 122 may also be a barrier layer for preventing diffusion of subsequent metal layers. The first and second etch stop liners 121 and 122 may comprise the same material composition in various embodiments. However, in some embodiments, the first and second etch stop liners 121 and 122 may be different materials, for example, when the composition of the first insulating layer 131 and the third insulating layer 133 are significantly different.

As illustrated in FIG. 1A, the second metal line level M2 and first via level V1 are disposed in a third insulating layer 133. Although the third insulating layer 133 may comprise a ILD material as described above, the third insulating layer 133 is separated from the second insulating layer 132 by a second etch stop liner 122. In various embodiment, a portion of the second etch stop liner 122 forms the capacitor dielectric of the capacitor 102.

As illustrated in FIG. 1A, the height of the metal lines ($H_M$) is smaller than the height of the electrical connection of the capacitor plate ($H_C$). As illustrated, the capacitor plate extends through the height of the third insulating layer 133. As further illustrated in FIG. 1B, the length and width of the metal lines ($L_M$ and $W_M$) and the length and width of the capacitor plates ($L_C$ and $W_C$) are comparable and much bigger than the length and width of the vias or may consist of many vias.

FIGS. 2A-2H illustrates a semiconductor device during various stages of fabrication in accordance with an embodiment of the present invention.

The invention will now be described with respect to embodiments in a specific context, namely a structure and method for forming a capacitor structure compatible with standard CMOS flow. Embodiments of the present invention may also be applied to other capacitive structures such as floating gate transistors.

Figure 2A:
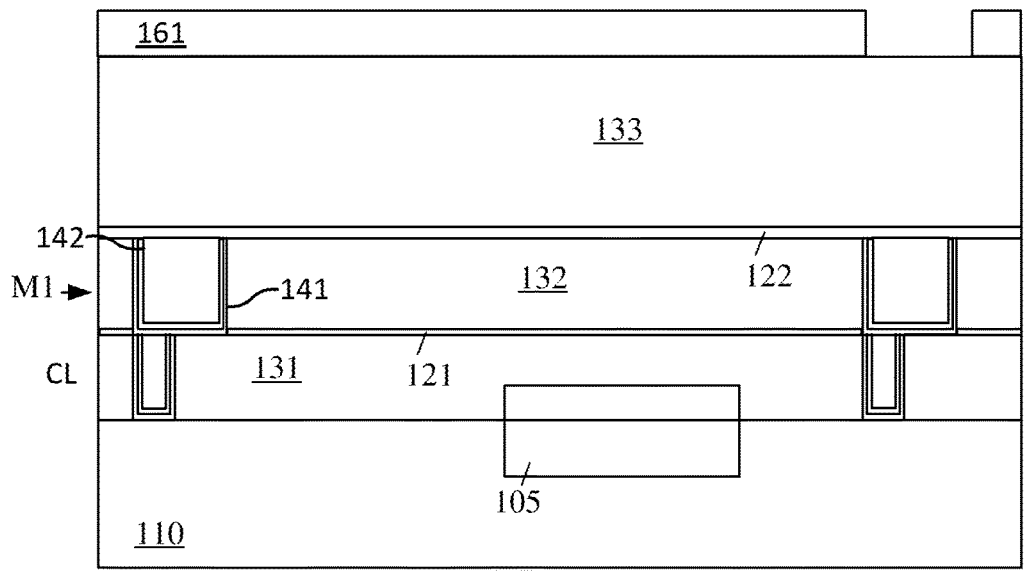
FIGS. 2A-2H illustrate a semiconductor device during various stages of fabrication in accordance with an embodiment of the present invention.

Referring to FIG. 2A, the device region 105 is formed. The device region 105 may include a transistor, diode, and other active or passive devices in various embodiments. Contacts are made to the device region 105, which may include forming silicide regions. Next, the device undergoes back end of the line manufacturing, wherein, contacts are made to the semiconductor body and interconnected using metal lines and vias.

As illustrated in FIG. 2A, a first metal level M1 and the contact level (CL) are formed over the substrate 110. A first insulating layer 131 is deposited over the substrate 110. In various embodiments, the first insulating layer 131 may include one or more insulating layers and may include a etch stop liner. The contacts of the CL level are formed within the first insulating layer 131.

A second insulating layer 132 is deposited over the first insulating layer 131 after forming a first etch stop liner 121.

In various embodiments, the first metal level M1 and the contact level may be metal levels that are not the lowest metal level and via levels. Other metal levels may be disposed between the first metal level M1 and the substrate 110, for example.

In various embodiments, the first metal level M1 and the contact level may be formed using damascene or dual damascene processes. Further in alternative embodiments, the first metal level M1 and the contact level may be formed using a fill process, and/or silicide process.

One or more further level may comprise a dual-tier opening having an upper conductive line and a lower conductive via. The upper conductive line may be an opening such as a trench (but may also be a hole), and may be filled with a metal. Conductive via may be an opening such as a hole (but may also be a trench) and may be also filled with a metal.

A third insulating layer 133 is then formed over a second etch stop liner 122. The second etch stop liner 122 is deposited over the second insulating layer 132. For example, a nitride film (e.g., silicon nitride) is deposited in one embodiment. In various embodiments, the second etch stop liner 122 may comprise an oxide, a nitride, or an oxynitride such as silicon dioxide, silicon nitride, silicon oxynitride, and others. In alternative embodiments, the second etch stop liner 122 may comprise boron doped layers includes BPSG, boron nitride, silicon boron nitride, silicon carbon nitride, silicon germanium, germanium, carbon based layers such as amorphous carbon. In further embodiments, the second etch stop liner 122 may comprise silicon carbide including SiC:H comprising various combinations of C—H, Si—H, Si—CH$_3$, Si—(CH$_2$)$_n$, and Si—C.

In various embodiments, the second etch stop liner 122 comprises an insulating material having a different etch rate than the third insulating layer 133 to be deposited thereupon. As an illustration, in one embodiment, the second etch stop liner 122 etches at least ten times faster than the third insulating layer 133.

In various embodiments, the second etch stop liner 122 is also a diffusion barrier layer for the metal in the underlying conductive metal lines. For example, the second etch stop liner 122 prevents the underlying copper from diffusing into the adjoining insulation regions.

The third insulating layer 133 comprises insulating materials including inter-level dielectric (ILD) materials, such as SiO$_2$, tetra ethyl oxysilane (TEOS), fluorinated TEOS (FTEOS), doped glass (BPSG, PSG, BSG), organo silicate glass (OSG), fluorinated silicate glass (FSG), spin-on glass (SOG), SiN, SiON, or low k insulating materials, e.g., having a dielectric constant of about 4 or less, or combinations or multiple layers thereof, as examples, although alternatively, the third insulating layer 133 may comprise other materials. The third insulating layer 133 may also comprise dense SiCOH or a porous dielectric having a k value of about 3 or lower, as examples. The third insulating layer 133 may also comprise an ultra-low k (ULK) material having a k value of about 2.3 or lower, for example. The third insulating layer 133 may comprise a thickness of about 500 nm or less, for example, although alternatively, the third insulating layer 133 may comprise other dimensions.

In one exemplary process illustrated in FIG. 2A, a photoresist layer 161 is deposited over the third insulating layer 133, exposed, developed, and patterned to mask off the non-exposed regions to the etch. In one or more embodiments, a hard mask layer may be deposited prior to depositing the photoresist layer 161 and patterned using the photoresist layer 161.

Figure 2B:
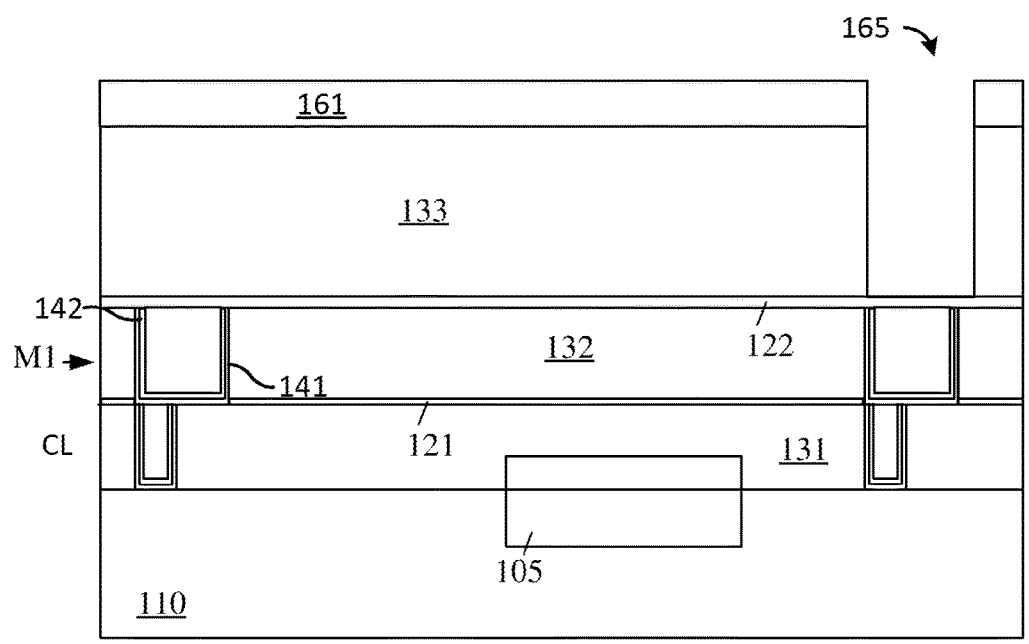

As next illustrated in FIG. 2B, the third insulating layer 133 is then etched down to the second etch stop liner 122 using standard etch techniques such as a reactive ion etch. In this step, the third insulating layer 133 etches away at a faster rate than the second etch stop liner 122. Therefore, the reactive ion etch is stopped on the second etch stop liner 122 forming an etch opening 165. The opening 165 may be in the form of a hole. However, in various embodiments, the second etch stop liner 122 is not removed as in conventional processing for forming vias. Therefore, no electrical contact is possible between the conductive feature to be formed in the opening 165 with the underlying metal line in the first insulating layer 131.

Figure 2C:
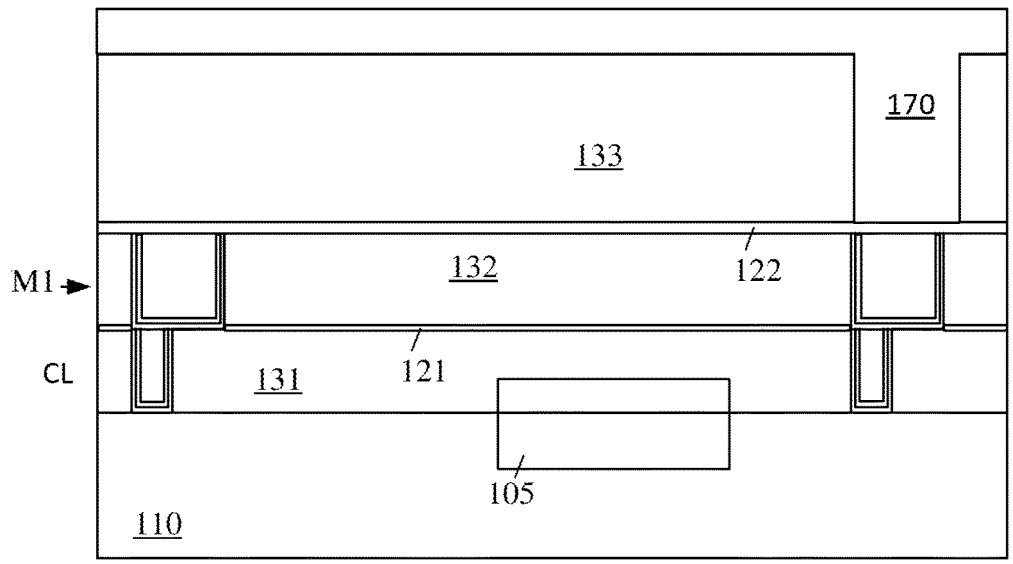

Referring to FIG. 2C, a first sacrificial material 170 is deposited into the etch opening 165. The first sacrificial material 170 may be a glassy material that can be deposited using a spin-on-process in one or more embodiments. Alternatively, in other embodiments, the first sacrificial material 170 may be deposited using other types of deposition process and may include other materials. In one or more embodiments, the first sacrificial material 170 comprises a low-k dielectric material. In a further embodiment, the first sacrificial material 170 comprises a photo resist material. In one embodiment, the first sacrificial material 170 comprises an anti-reflective coating material. In a further embodiment, the first sacrificial material 170 comprises a carbon containing material including amorphous carbon. In an embodiment, a hydrogen-containing carbon layer is deposited over the third insulating layer 133 to form the first sacrificial material 170. In various embodiments, the first sacrificial material 170 may be deposited using a chemical vapor deposition (CVD), physical vapor deposition (PVD), plasma enhanced chemical vapor deposition (PE-CVD) process, spin-on coating, or other processes.

In various embodiments, the first sacrificial material 170 comprises a material having a high etch selectivity relative to the third insulating layer 133 and the second etch stop liner 122 so that the first sacrificial material 170 may be removed without etching the third insulating layer 133 or the underlying second etch stop liner 122. For example, the first sacrificial material 170 etches at least ten times faster relative to the third insulating layer 133 and the second etch stop liner 122.

Figure 2D:
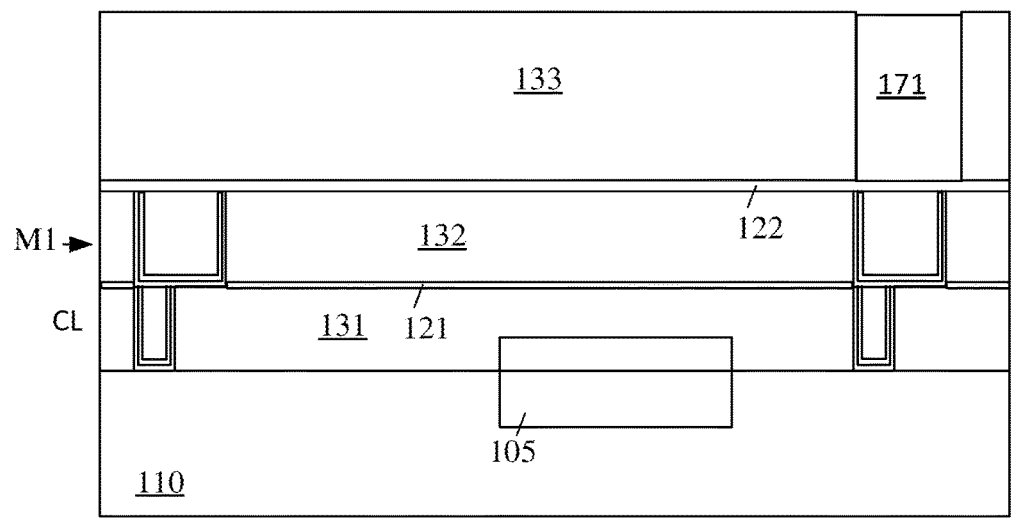

The first sacrificial material 170 may be planarized as next illustrated in FIG. 2D leaving behind a sacrificial plug 171. Accordingly, a chemical mechanical planarizing process may be used in one embodiment.

Figure 2E:
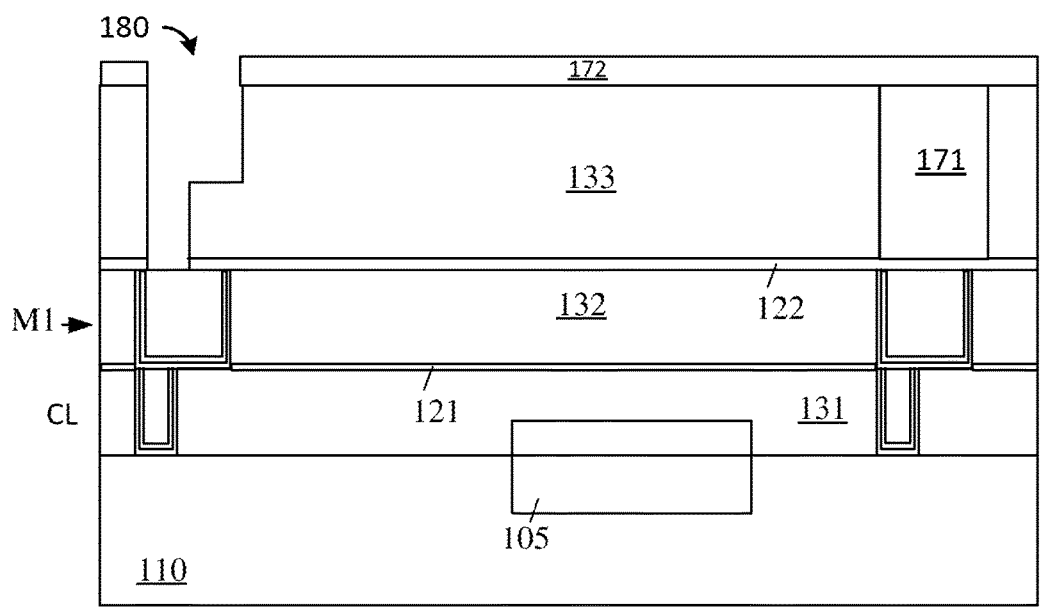

Referring to FIG. 2E, an opening 180 for metal line and via are formed in an example using a dual damascene process. In various embodiments, the opening 180 may be formed by depositing a photo resist layer and patterning for the via followed by depositing another photo resist layer and patterning for metal lines. The structured masking material 172 may include developed photo resist layer and one or more layers of hard mask layers underneath the photo resist layer.

Figure 2F:
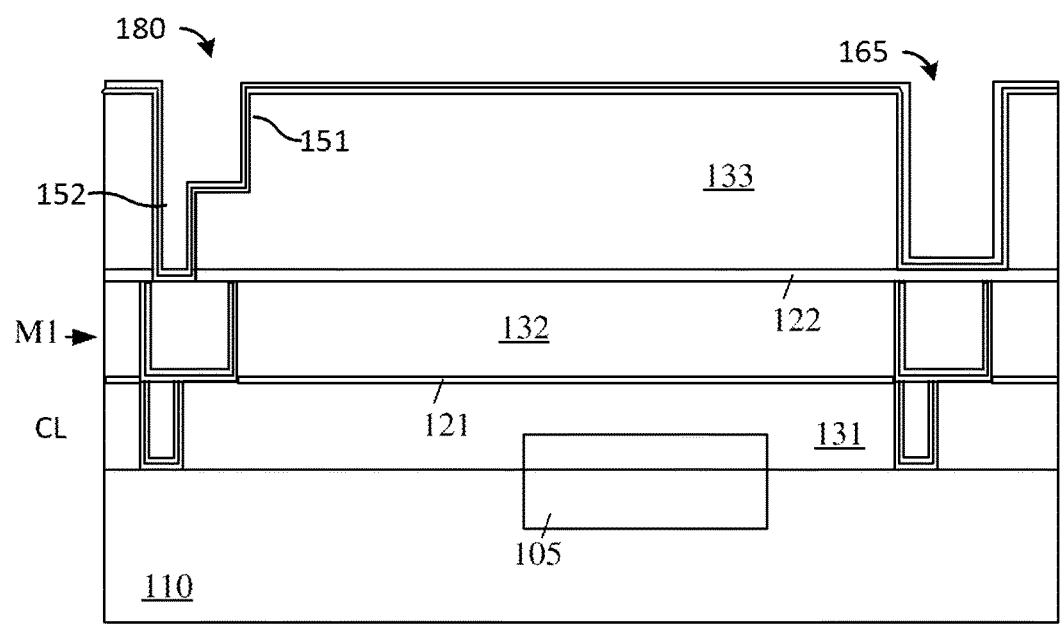

As next illustrated in FIG. 2F, a first conductive liner 151 and a second conductive liner 152 are deposited. Before depositing the first conductive liner 151 and the second conductive liner 152, any masking material 172 used for forming the metal lines and vias as well as sacrificial materials such as sacrificial plug 171 are removed. This may be accomplished using an etching process such as a wet chemical etching process.

As illustrated in FIG. 2F, a first conductive liner 151 may be deposited prior to filling the openings with a conductive fill material. The first conductive liner 151 is conformal, and may comprise a single layer of Ta, TaN, WN, WSi, Ti, TiN, Ru, Co and combinations thereof, as examples. In further examples of materials which may be used for the first conductive liner 151 include tantalum silicon nitride, tungsten, titanium tungsten or the like.

The first conductive liner 151 may be typically used as a barrier layer for preventing metal from diffusing into the underlying semiconductor material or second insulating layer 132. The first conductive liner 151 may be deposited, for example, using a chemical vapor deposition (CVD), physical vapor deposition (PVD) or Atomic layer Deposition (ALD) process.

A second conductive liner 152 is then deposited similarly using, for example, a CVD, PVD, or ALD process over the first conductive liner 151. The second conductive liner 152 may be seed layer, for example, comprising copper, for subsequent electroplating of copper.

In various embodiments, the first and the second conductive liners 151 and 152 are deposited using a conformal deposition process, leaving a conformal liner or diffusion barrier along the interior walls of openings 180 and 165. In one embodiment, the first conductive liner 151 comprises tantalum nitride deposited by physical vapor deposition (PVD). Alternatively, the first conductive liner 151 may comprise titanium nitride, tungsten nitride, a refractory metal or other barrier layers that may be conformally deposited, for example, using CVD, PVD processes or electro-less plating. The first conductive liner 151 may comprise a bi-layer of material, including, for example, a barrier layer and a conformal seed layer, which may comprise copper, aluminum, other metals or combinations thereof.

The second conductive liner 152 may comprise a metallic material. The second conductive liner 152 may, for example, comprise a pure metal or an alloy. It is understood that any pure metal may include some amount of trace impurities. An alloy may include at least two metallic elements. An alloy may include a metallic element and a non-metallic element. The second conductive liner 152 may comprise one or more of the elements Cu (copper), Al (aluminum), Au (gold), Ag (silver), and W (tungsten). Examples of materials include pure copper, copper alloy, pure aluminum, aluminum alloy, pure gold, gold alloy, pure silver, silver alloy, pure tungsten and tungsten alloy. The second conductive liner 152 may be formed by a physical vapor deposition or sputtering process.

Figure 2G:
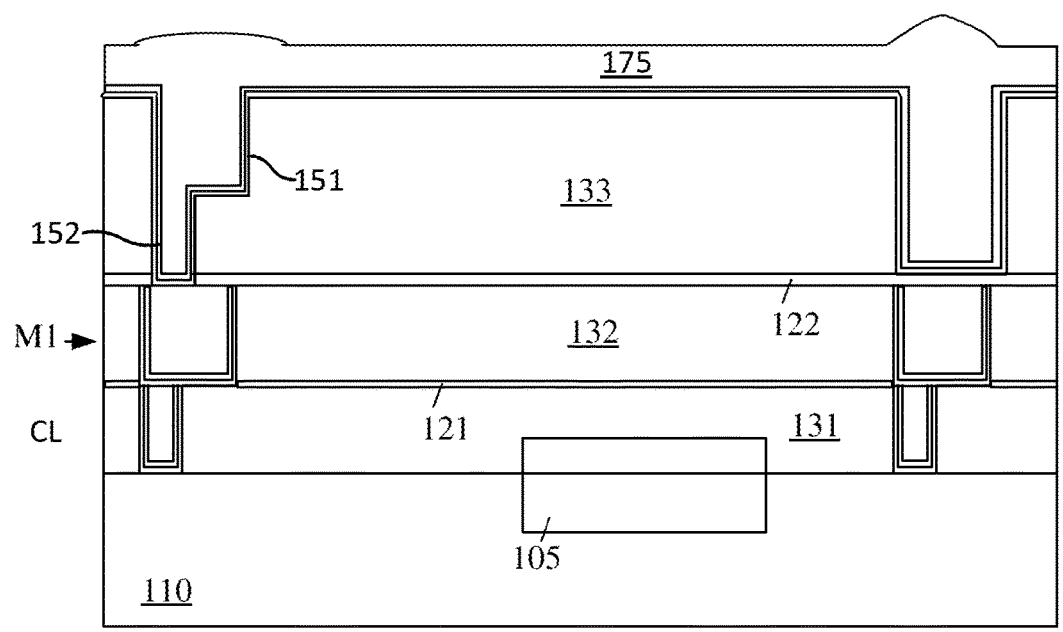

Referring to FIG. 2G, a conductive fill material 175 is deposited over the first and the second conductive liners 151 and 152. The conductive fill material 175 comprises a conductive material in various embodiments. The conductive fill material 175 may comprise a metallic material. The conductive fill material 175 may comprise a pure metal or an alloy. The conductive fill material 175 may comprise tungsten in one embodiment, although copper, aluminum, Al—Cu—Si, other metals and combinations thereof may also be used in other embodiments. In various embodiments, the conductive fill material 175 may comprise one or more of the elements Cu (copper), Al (aluminum), Au (gold), Ag (silver), and W (tungsten). Examples of materials include pure copper, copper alloy, pure aluminum, aluminum alloy, pure gold, gold alloy, pure silver, silver alloy, pure tungsten and tungsten alloy. The conductive fill material 175 may be formed by an electroplating (or electro-deposition) process.

If the conductive fill material 175 comprises tungsten, preferably a bi-layer seed layer comprising CVD titanium nitride and silicon doped tungsten are used as the first and second conductive liners 151 and 152. In other embodiments, the openings are filled with copper.

Figure 2H:
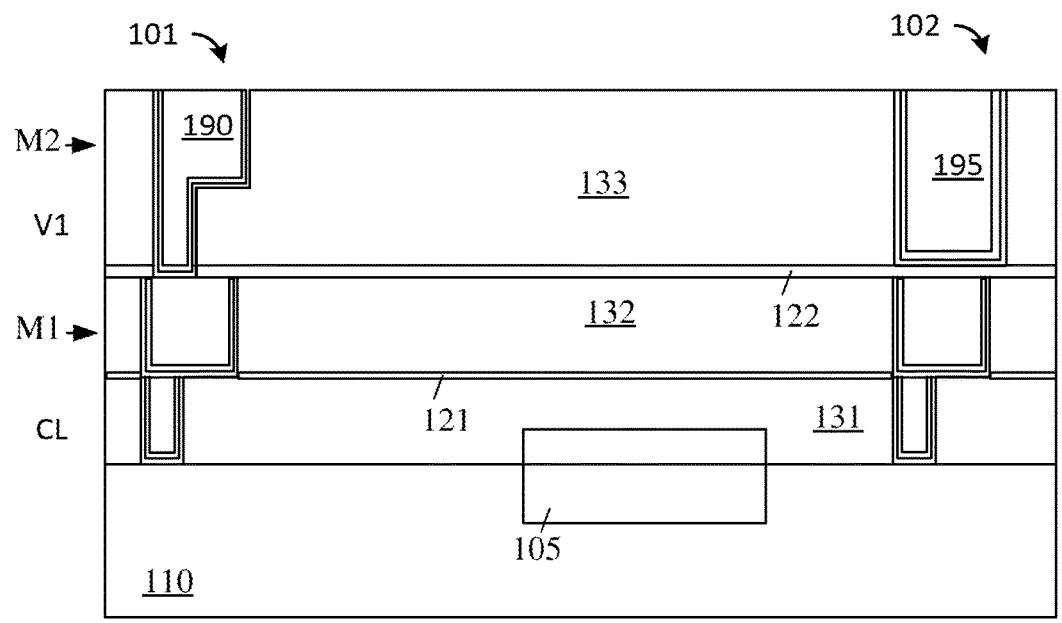

As next illustrated in FIG. 2H, excess portions of the conductive fill material 175 are removed from the top surface of the third insulating layer 133, e.g., using a chemical-mechanical polishing (CMP) process forming metal lines, vias, and the capacitor 102. The CMP process may also remove the exposed first and the second conductive liners 151 and 152 disposed over the top surface of the third insulating layer 133.

Accordingly, a capacitor 102 is formed simultaneously with the metal lines and vias while adding only a single extra mask process. Advantageously, most of the process steps are commonly shared with the metal line and via processing.

Figure 3A:
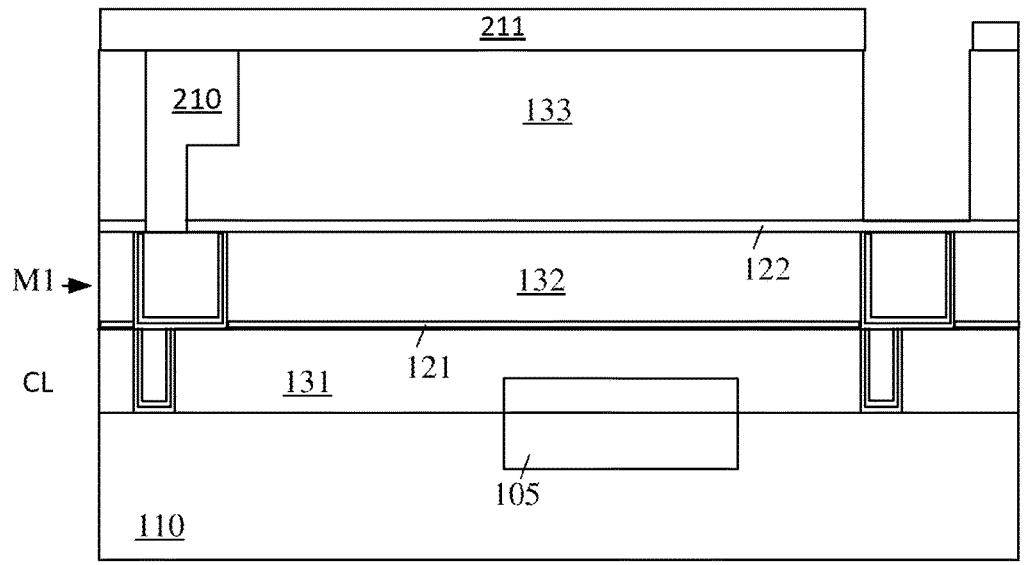
FIGS. 3A and 3B illustrate a cross-sectional view of a semiconductor device during various stages of processing in accordance with an alternative embodiment of the present invention.
Figure 3B:
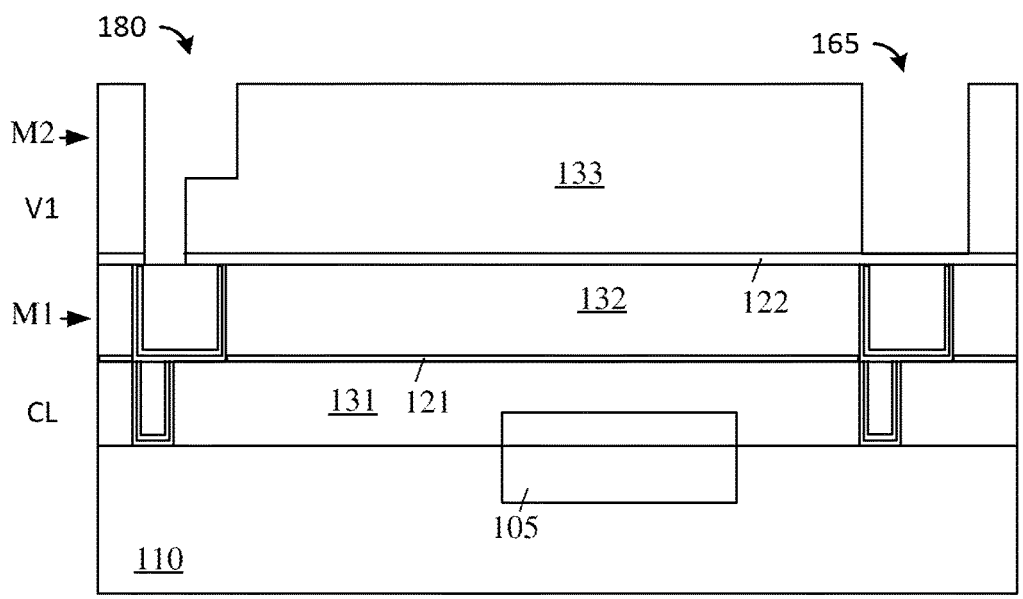

FIGS. 3A and 3B illustrate a cross-sectional view of a semiconductor device during various stages of processing in accordance with an alternative embodiment of the present invention.

In this embodiment, the opening for the capacitor is performed after forming the openings for the metal lines and vias. Therefore, after forming the openings for the metal lines and vias, a sacrificial fill material 210 is formed within them. The sacrificial fill material 210 may be similar to the material in the sacrificial fill material 175 in one or more embodiments.

After planarizing the sacrificial fill material 210, a masking layer 211 is formed and patterned for forming a etch mask for the capacitor opening pattern. Using the patterned masking layer 211 as an etch mask, the underlying third insulating layer 133 is etched, for example, using an anisotropic etching process. Thus, a capacitor plate opening 165 is formed in the third insulating layer 133.

Subsequently, as illustrated in FIG. 3B, the masking layer 211 is removed and the sacrificial fill material 210 may be removed. Subsequent processing may proceed as described in other embodiments.

Figure 4A:
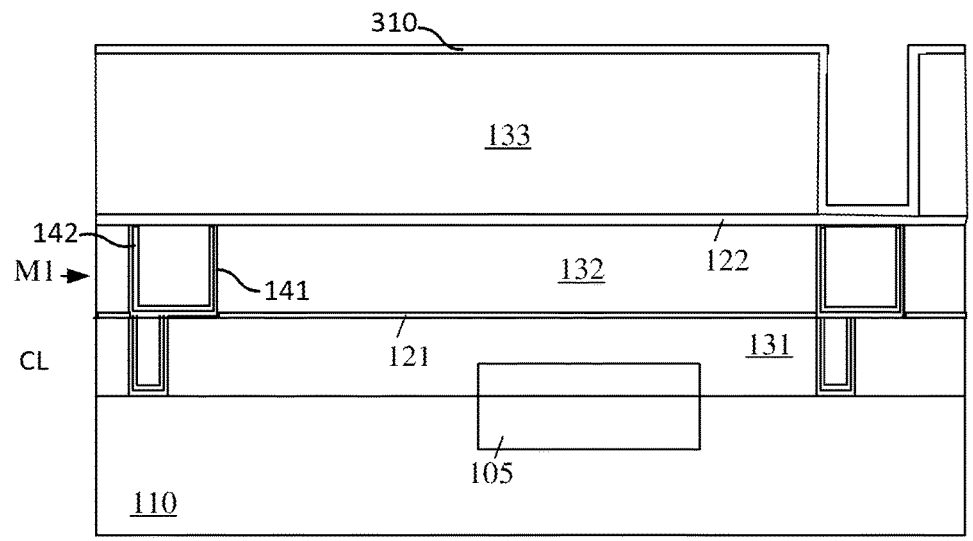
FIGS. 4A and 4B illustrates a further embodiment of forming a capacitor, wherein the capacitor comprises an additional dielectric layer besides the etch stop liner.
Figure 4B:
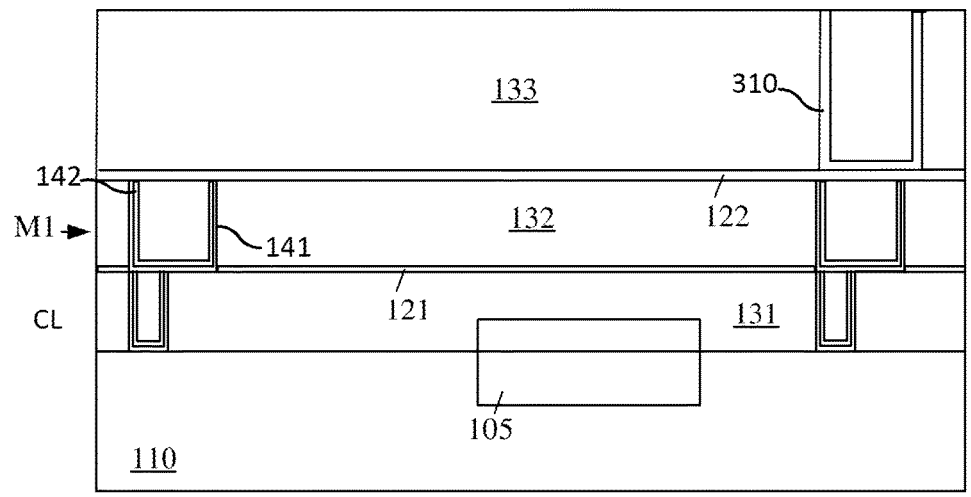

FIGS. 4A and 4B illustrates a further embodiment of forming a capacitor, wherein the capacitor comprises an additional dielectric layer besides the etch stop liner.

In this embodiment, an additional dielectric layer 310 may be formed after forming the capacitor plate opening 165. The additional dielectric layer 310 may be used to ensure any accidental shorting between the two capacitor plates. Accordingly, this embodiment may be used to overcome any yield issues without significantly increasing the capacitance.

Referring to FIG. 4A, the capacitor plate opening 165 after lining with the dielectric layer 310 is shown. The dielectric layer 310 may be any suitable dielectric layer including silicon dioxide, silicon nitride, high-k dielectric layers such as aluminum oxide, hafnium oxide, and combinations.

Figure 5A:
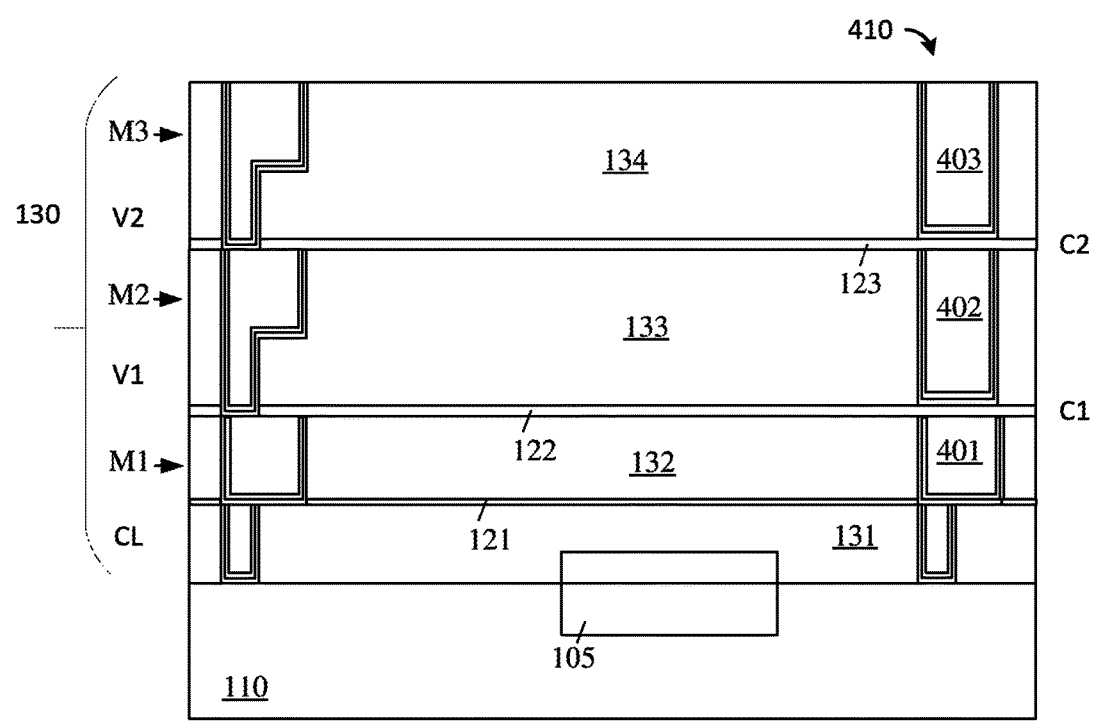
FIGS. 5A and 5B illustrate alternative embodiments of a floating capacitive structure, wherein FIG. 5A comprises a capacitor with a floating node, and wherein FIG. 5B comprises a floating gate transistor.
Figure 5B:
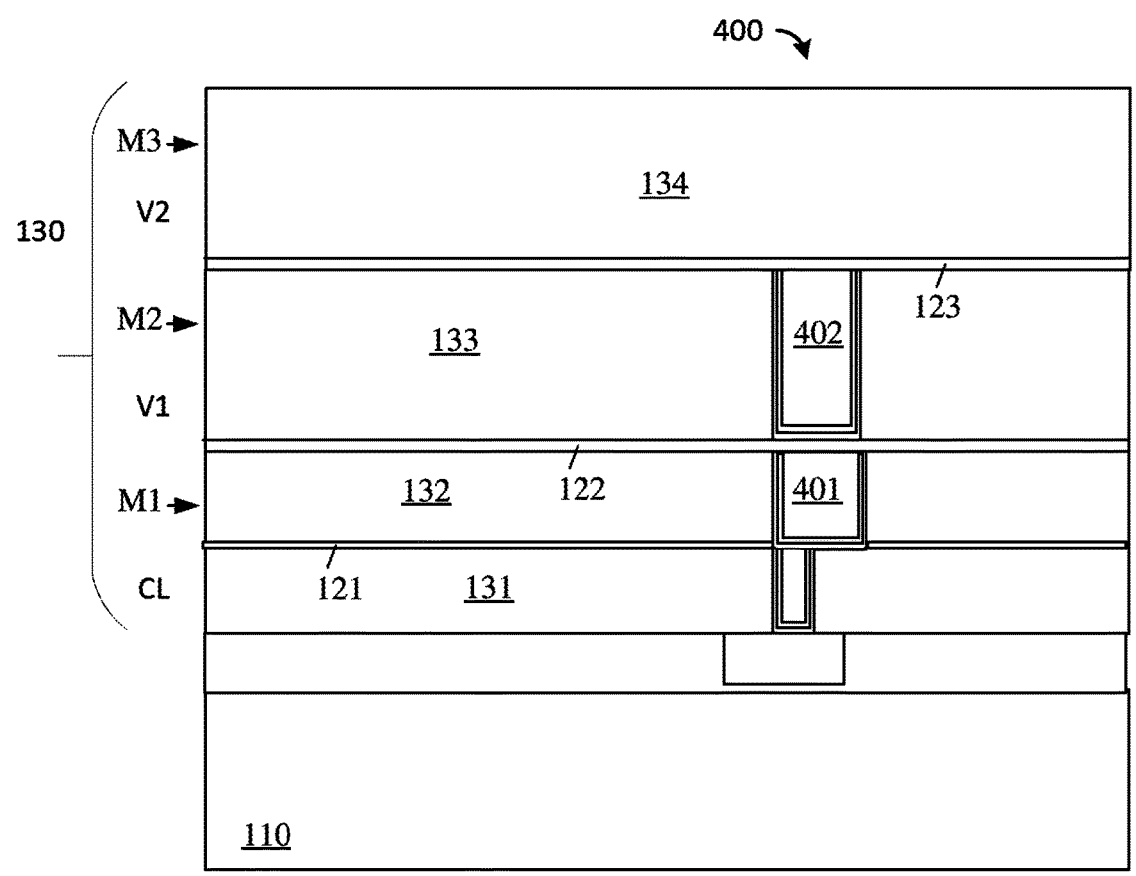

FIGS. 5A and 5B illustrate alternative embodiments of a floating capacitive structure, wherein FIG. 5A comprises a capacitor with a floating node, and wherein FIG. 5B comprises a floating gate transistor.

In an alternative embodiment, one of the capacitor plates may be floating. Referring to FIG. 5A, in this embodiment, the capacitor comprises a first plate 401 in a second insulating layer 132, a second plate 402 in a third insulating layer 133, and a third plate 403 in a fourth insulating layer 134. The first plate 401 is separated from the second plate 402 by the second etch stop liner 122 while the second plate 402 is separated from the third plate 403 by the third etch stop liner 123. In the illustrated embodiment of FIG. 5A, the second plate 402 is floating and is not coupled to a potential node. The first plate 401 and the third plate 403 may be coupled to different potential nodes.

In an alternative embodiment, this feature may be used as part of a floating gate device, for example, as illustrated in FIG. 5B. The first plate 401 is coupled to the floating gate in one embodiment. Accordingly, in this embodiment, the second plate 402 forms part of a control gate of a floating gate transistor 400. The first plate 401 is capacitively coupled to the second plate 402 through the second etch stop liner 122 as described in prior embodiments.

Figure 6:
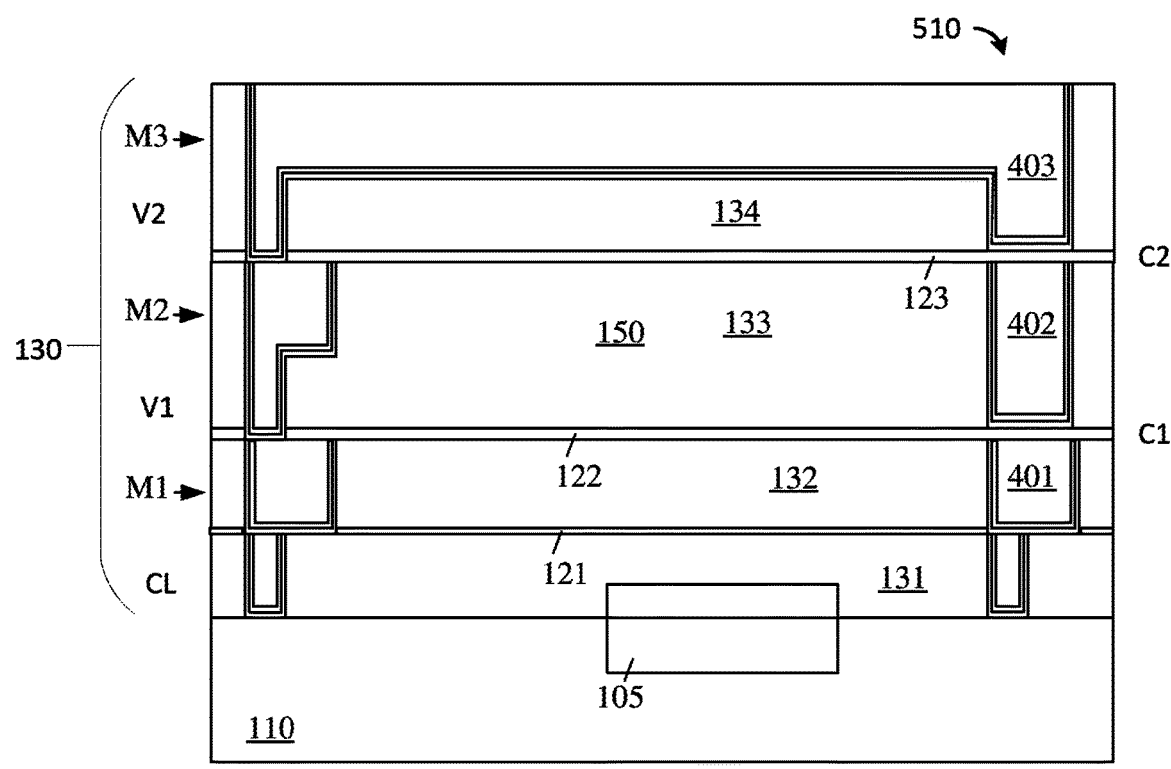
FIG. 6 illustrates the capacitor structure in accordance with an alternative embodiment.

FIG. 6 illustrates the capacitor structure in accordance with an alternative embodiment of the present invention.

As illustrated in FIG. 6, the third plate 403 may be coupled to the first plate 401 while the second plate 402 is coupled to another potential node. Accordingly, in this embodiment, the capacitance of the capacitive structure is doubled due to the capacitor at the top and bottom of the second plate 402.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a device comprising:
   forming a first metal feature and a second metal feature in a first insulating layer over a substrate;
   forming a first etch stop liner over the first insulating layer and the first metal feature and the second metal feature, the first insulating layer physically contacting the first etch stop liner;
   forming a second insulating layer over the first insulating layer, the second insulating layer physically contacting the first etch stop liner;
   forming a first opening, in the second insulating layer, directly over the first metal feature, wherein a portion of the first etch stop liner covers the underlying first metal feature;
   filling the first opening with a sacrificial material;
   after filling the first opening with the sacrificial material, depositing, over the second insulating layer, a photo resist layer and a hard mask layer under the photo resist layer and structuring the photo resist layer and the hard mask layer, wherein the first opening extends completely through the second insulating layer;
   after the structuring, forming a second opening in the second insulating layer and the underlying first etch stop liner, the second opening exposing the second metal feature; and
   forming a third metal feature and a fourth metal feature by filling the first opening and the second opening in the second insulating layer, wherein the third metal feature is separated from the first metal feature by a portion of the first etch stop liner between the first and the second insulating layers, and wherein the third metal feature is capacitively coupled to the first metal feature through the first etch stop liner.

2. The method of claim 1, further comprising:
   forming a second etch stop liner over the third metal feature, the fourth metal feature, and the second insulating layer;
   forming a third insulating layer over the second etch stop liner; and
   forming a fifth metal feature in the third insulating layer and separated from the third metal feature by a portion of the second etch stop liner, wherein the fifth metal feature is capacitively coupled to the third metal feature through the portion of the second etch stop liner.

3. The method of claim 2, wherein the first metal feature and the fifth metal feature are coupled to the same potential node.

4. The method of claim 2, wherein the third metal feature is a floating gate, and the fifth metal feature is a control gate.

5. The method of claim 1, wherein the first metal feature is coupled to a floating gate and the third metal feature is coupled to a control node.

6. The method of claim 1, wherein the first etch stop liner comprises a silicon nitride layer.

7. The method of claim 1, wherein forming the third metal feature comprises using a common deposition process with a metal line deposition process.

8. The method of claim 1, wherein forming the first opening comprising etching a portion of the second insulating layer and stopping the etching at the first etch stop liner, wherein the first etch stop liner is an etch stop during the forming of the first opening.

9. A method of forming a device comprising:
   forming a first metal feature and a second metal feature in a first insulating layer over a substrate;
   forming a first etch stop liner over the first insulating layer and the first metal feature and the second metal feature, the first insulating layer physically contacting the first etch stop liner;
   forming a second insulating layer over the first insulating layer, the second insulating layer physically contacting the first etch stop liner;
   forming a first opening, in the second insulating layer, directly over the second metal feature, the first opening exposing the second metal feature;
   filling the first opening with a sacrificial material;
   after filling the first opening with the sacrificial material, depositing, over the second insulating layer, a photo resist layer and a hard mask layer under the photo resist layer and structuring the photo resist layer and the hard mask layer;
   using the structured hard mask layer, forming a second opening in the second insulating layer without etching an exposed underlying portion of the first etch stop liner, wherein the second opening extends completely through the second insulating layer, wherein a portion of the first etch stop liner covers the underlying first metal feature; and
   without removing the portion of the first etch stop liner, forming a third metal feature by filling the first opening in the second insulating layer and forming a fourth metal feature by filling the second opening in the second insulating layer, wherein the fourth metal feature is separated from the first metal feature by the portion of the first etch stop liner between the first and the second insulating layers, and wherein the fourth metal feature is capacitively coupled to the first metal feature through the first etch stop liner.

10. The method of claim 9, further comprising:
    forming a second etch stop liner over the third metal feature, the fourth metal feature, and the second insulating layer;
    forming a third insulating layer over the second etch stop liner; and
    forming a fifth metal feature in the third insulating layer and separated from the third metal feature by a portion of the second etch stop liner, wherein the fifth metal feature is capacitively coupled to the third metal feature through the portion of the second etch stop liner.

11. The method of claim 10, wherein the third metal feature is a floating gate, and the fifth metal feature is a control gate.

12. The method of claim 10, wherein the first metal feature and the fifth metal feature are coupled to the same potential node.

13. The method of claim 10, wherein the first metal feature, the second metal feature, the third metal feature, and the fourth metal feature are formed using metal line deposition processes.

14. The method of claim 9, further comprising removing the sacrificial material after forming the second opening.

15. The method of claim 9, wherein forming the first opening comprises:
    etching a portion of the second insulating layer and stopping the etching at the first etch stop liner, wherein the first etch stop liner is an etch stop during the forming of the first opening; and
    etching the exposed first etch stop liner using a different etching step.

16. A method of forming a device comprising:
    forming a first metal feature and a second metal feature in a first insulating layer over a substrate;
    forming a first etch stop liner over the first insulating layer and the first metal feature and the second metal feature, the first insulating layer physically contacting the first etch stop liner;
    forming a second insulating layer over the first insulating layer, the second insulating layer physically contacting the first etch stop liner;
    forming a first opening, in the second insulating layer, directly over the first metal feature, wherein a portion of the first etch stop liner covers the underlying first metal feature;
    filling the first opening with a sacrificial material;
    after filling the first opening with the sacrificial material, depositing, over the second insulating layer, a photo resist layer and a hard mask layer under the photo resist layer and structuring the photo resist layer and the hard mask layer, wherein the first opening extends completely through the second insulating layer;
    after the structuring, forming a second opening in the second insulating layer and the underlying first etch stop liner, the second opening exposing the second metal feature;
    forming a third metal feature and a fourth metal feature by filling the first opening and the second opening in the second insulating layer, wherein the third metal feature is separated from the first metal feature by a portion of the first etch stop liner between the first and the second insulating layers, and wherein the third metal feature is capacitively coupled to the first metal feature through the first etch stop liner; and
    removing the sacrificial material after forming the second opening.

17. The method of claim 16, further comprising:
    forming a second etch stop liner over the third metal feature, the fourth metal feature, and the second insulating layer;
    forming a third insulating layer over the second etch stop liner; and
    forming a fifth metal feature in the third insulating layer and separated from the third metal feature by a portion of the second etch stop liner, wherein the fifth metal feature is capacitively coupled to the third metal feature through the portion of the second etch stop liner.

18. The method of claim 17, wherein the first metal feature and the fifth metal feature are coupled to the same potential node.

19. The method of claim 17, wherein the third metal feature is a floating gate, and the fifth metal feature is a control gate.

20. The method of claim 16, wherein the first metal feature is coupled to a floating gate and the third metal feature is coupled to a control node.

21. The method of claim 16, wherein forming the third metal feature comprises using a common deposition process with a metal line deposition process.

* * * * *